US008194373B2

(12) United States Patent
Padden

(10) Patent No.: US 8,194,373 B2
(45) Date of Patent: Jun. 5, 2012

(54) ELECTROSTATIC DISCHARGE PROTECTION CIRCUIT

(75) Inventor: Paul Padden, Oxfordshire (GB)

(73) Assignee: Toumaz Technology Limited, Oxfordshire (GB)

( * ) Notice: Subject to any disclaimer, the term of this patent is extended or adjusted under 35 U.S.C. 154(b) by 4 days.

(21) Appl. No.: 12/671,281

(22) PCT Filed: Jul. 14, 2008

(86) PCT No.: PCT/GB2008/050568
§ 371 (c)(1), (2), (4) Date: Jan. 29, 2010

(87) PCT Pub. No.: WO2009/016397
PCT Pub. Date: Feb. 5, 2009

(65) Prior Publication Data
US 2010/0188788 A1 Jul. 29, 2010

(30) Foreign Application Priority Data
Jul. 30, 2007 (GB) .................................. 0714703.6

(51) Int. Cl.
*H02H 9/00* (2006.01)
(52) U.S. Cl. ......................................... 361/56; 361/118
(58) Field of Classification Search ..................... 361/56
See application file for complete search history.

(56) References Cited

U.S. PATENT DOCUMENTS 5,654,862 A 8/1997 Worley et al.
5,693,973 A 12/1997 Nakano et al.
5,721,658 A 2/1998 Ma et al.
5,991,135 A 11/1999 Saleh
6,078,068 A 6/2000 Tamura
6,144,542 A * 11/2000 Ker et al. ...................... 361/111
6,756,834 B1 6/2004 Tong et al.
7,072,158 B2 * 7/2006 Wang .............................. 361/56
7,411,767 B2 * 8/2008 Huang et al. .................... 361/56
2004/0141269 A1 7/2004 Kitagawa
2005/0087887 A1 4/2005 Behzad et al.
2005/0270712 A1 12/2005 Huang et al.
2007/0091521 A1 4/2007 Hsueh et al.

FOREIGN PATENT DOCUMENTS

WO WO 2007/013145 2/2007

OTHER PUBLICATIONS

International Search Report, dated Mar. 30, 2009, issued in International Application No. PCT/GB2008/050568.
International Preliminary Report on Patentability, dated Nov. 30, 2009, issued in International Application No. PCT/GB2008/050568.
Search Report, dated Nov. 27, 2007, issued in priority GB Application No. GB0714703.6.
Examination Report, dated Dec. 22, 2011, issued in corresponding European Application No. 08 776 203.5.

* cited by examiner

*Primary Examiner* — Dharti Patel
(74) *Attorney, Agent, or Firm* — Saul Ewing LLP

(57) ABSTRACT

An integrated circuit having a plurality of circuit blocks, each block having one or more positive voltage supply pads, one or more negative voltage supply pads, and one or more signal pads. The integrated circuit further comprises an electrostatic protection circuit comprising a first electrostatic discharge protection rail for connection to a positive voltage supply point, a second electrostatic discharge protection rail for connection to a negative voltage supply point, and first protection circuitry coupling each said signal pad to both said first and second electrostatic discharge protection rails, the first protection circuitry being configured to provide a conduction path to one of the first and second rings in the event of an excessive voltage being present on one of said signal pads.

5 Claims, 4 Drawing Sheets

SP1
Pad VDD1
Pad VDD2
Pad VSS1
Pad VSS2
$DD_{1-C}$
$DD_{2-C}$
VDDCOM
VSSCOM
$DD_{3-C}$
$DD_{4-C}$
Pad VDD3
Pad VDD4
Pad VSS3
Pad VSS4

ELECTROSTATIC DISCHARGE PROTECTION CIRCUIT

CROSS REFERENCE TO RELATED APPLICATIONS

This application claims the priority of PCT/GB2008/050568, filed on Jul. 14, 2008, which claims priority to Great Britain Application No. 0714703.6, filed Jul. 30, 2007, the entire contents of which are hereby incorporated in total by reference.

TECHNICAL FIELD

The present invention relates to an electrostatic discharge (ESD) protection circuit and, more particularly, to an ESD protection circuit for a System on Chip (SoC) susceptible to damage due to electrostatic discharge.

BACKGROUND

It is well known that electrostatic discharge (ESD) can present a problem in small-scale devices such as integrated circuits (ICs). This is because in an IC having ground and supply pins and pads, an ESD spike on one pin/pad may destroy the entire chip. A number of ways of addressing this problem have been suggested. It is known to provide an IC with circuitry which, in the event of an electrostatic discharge, forms a current discharge path for the ESD current and clamps the voltage of the IC pads at a sufficiently low level to prevent damage to components of the IC. FIGS. 1 and 2 show an example of a known arrangement for providing ESD protection.

FIG. 1 shows, schematically, two circuit blocks 1, 2 of an IC. The blocks 1, 2 may represent respectively analogue and digital circuitry components of the IC and each is assumed to be supplied by a different off-chip supply voltage. In the case of block 1, this supply voltage is Vdd1, and in the case of block 2 the supply voltage is Vdd2. The blocks operate at negative supply voltages Vss1 and Vss2, although in practice both negative supply voltages are ground.

Each block 1, 2 is provided with a series of bonding pads (represented by small square boxes, with the pads of block 1 being shown cross-hatched) that are connected to the pins (not shown) of the IC provided externally of the IC. For each block, at least one of the pads is connected to the positive voltage supply pin (Vdd) and at least one is connected to the negative voltage supply pin (Vss). These pads are referred to collectively hereinafter as "voltage supply" pads. Others of the pads are connected to digital/analogue signal inputs/output pins, clock signal pins, etc. These other pads are referred to hereinafter as "signal" pads.

In order to provide ESD protection, a number of ESD protection rings extend around the entire periphery of the chip. One ring is provided for each Vdd and one for each Vss. Thus, in the example of FIG. 1, four ESD protection rings are provided. Each ring is connected directly to a corresponding one of the voltage supply pins of the IC package. Thus, ring 3 in FIG. 1 is connected to Vdd1, ring 4 to Vss1, ring 5 to Vdd2, and ring 6 to VSS2. Each voltage supply pad is coupled to each ring of the same polarity via ESD protection circuitry that is designed to provide a discharge path should the voltage on a given pad exceed a breakdown voltage (e.g. due to a voltage spike). Each of the signal pads associated with a given block is coupled to both of voltage supply pads of that block via further ESD protection circuitry. Thus, for example, a signal pad of block 1 will be coupled to the voltage supply pads providing Vdd1 and Vss1.

FIG. 2 shows in detail the ESD protection configuration for one block (powered by Vdd1 and Vss1) in the case of a four block IC having respective positive and negative supply voltages (Vdd1 to Vdd4, and Vss1 to Vdd4). Back-to-back diodes are connected between the voltage supply pads Vdd1 and Vss1 and each ESD protection ring of the same polarity. Each ESD protection ring is connected to a pad which is connected directly to the corresponding voltage supply pin (FIG. 2 shows only the pads for Vdd1 and Vss1). It is to be noted that the voltage on the Vdd1 pad cannot be more than the diode forward voltage (nominally 0.7 volts) above or below the voltages on the ESD protection rings of the other positive supply voltages, as one or other of the diodes will turn on and conduct to discharge that pad voltage. The same is true for the Vss1 pad.

It will be appreciated that this ESD protection configuration provides protection not only during operation of an IC, but also during the wire bonding operation during which pads on the chip are bonded to associated pins of the IC package, providing that the first pads to be bonded are the Vsscom and Vddcom pads to which the ESD protection rings are connected. Thereafter, any spike appearing at a voltage supply or signal pad will be conducted through the one or more back-to-back diode pairs to which it is coupled and through one of the ESD protection rings to the connected Vdd or Vss pad.

The need for a pair of ESD protection rails for each unit of a SoC is a significant disadvantage. For example, an SoC having five internal blocks would require five pairs of ESD rings, which potentially increases the size of the chip and creates preferential breakdown mechanisms as some tracks may have lower ohmic paths than others (e.g. if connections are made with different lengths of wiring). A further disadvantage is that the requirement for pairs of back-to-back diodes between each voltage supply pad and each and every other ESD protection ring of the same polarity necessitates a high number of diodes and circuitry connections on the chip, which again can increase the size of the chip and introduce further breakdown mechanisms.

SUMMARY

According to a first aspect of the present invention there is provided an integrated circuit having a plurality of circuit blocks, each block having one or more positive voltage supply pads, one or more negative voltage supply pads, and one or more signal pads. The integrated circuit further comprises an electrostatic protection circuit comprising a first electrostatic discharge protection rail for connection to a positive voltage supply point, a second electrostatic discharge protection rail for connection to a negative voltage supply point, and first protection circuitry coupling each said signal pad to both said first and second electrostatic discharge protection rails, the first protection circuitry being configured to provide a conduction path to one of the first and second rings in the event of an excessive voltage being present on one of said signal pads.

It is an advantage of at least certain embodiment of the invention that, in comparison with the known circuits discussed above, only a single ESD voltage supply and negative (e.g. ground) rail are required. This enables the IC to be constructed with fewer components and connections, thus minimising the physical size thereof, and reducing the electrical connection complexity. There is also no need to provide protective circuitry between each and every pair of supply pads—as in the known example. Furthermore, connecting all negative (ground) pads to a common ground rail avoids the need for each ground pad to be connected to every other ground pad by way of additional protective circuitry.

In order to provide ESD protection for said negative (e.g. ground) supply pads, the second electrostatic discharge protection rail may be connected to each said negative supply voltage pad. Similarly, in order to provide ESD protection for the positive supply pads, second protection circuitry coupling each said positive voltage supply pad to said first electrostatic discharge protection rail may be provided, with the second protection circuitry being configured to provide a conduction path to the first ring in the event of an excessive voltage being present on one of said positive voltage supply pads.

In an embodiment of the invention, said first and second protection circuitry comprises, for each pad, a pair of back-to-back diodes coupling the pad to a corresponding one of the electrostatic discharge protection rails.

The invention is applicable, in one example, to the case where the positive voltage supply pads of different circuit blocks are connected to different voltage supply pins of the integrated circuit.

In order to facilitate connection of pads to the ESD protection rings, these rings may extend substantially around the entire periphery of the integrated circuit.

According to a second aspect of the present invention there is provided an integrated circuit having a plurality of circuit blocks, each block having one or more positive voltage supply pads, one or more negative voltage supply pads, and one or more signal pads. The integrated circuit further comprising an electrostatic protection circuit comprising a first electrostatic discharge protection rail for connection to a positive voltage supply point, first protection circuitry coupling each said positive voltage supply pad to said first electrostatic discharge protection rail, the first protection circuitry being configured to provide a conduction path to the first ring in the event of an excessive voltage being present on one of said positive voltage supply pads, a second electrostatic discharge protection rail for connection to a negative voltage supply point and to each said negative supply voltage pad, and second protection circuitry coupling each said signal pad to both said first and second electrostatic discharge protection rails, the second protection circuitry being configured to provide a conduction path to one of the first and second rings in the event of an excessive voltage being present on one of said signal pads.

DETAILED DESCRIPTION

As has been described above, System on Chip (SoC) ESD protection circuits have in general relied upon the provision of a pair of peripherally extending ESD protection rings for each unit within the system, where each unit requires its own positive and negative supply voltages. These approaches have failed to recognise that for each polarity, a single ESD protection ring is sufficient, provided that ring is coupled to all of the supply voltage pads of that polarity.

Figure 3:
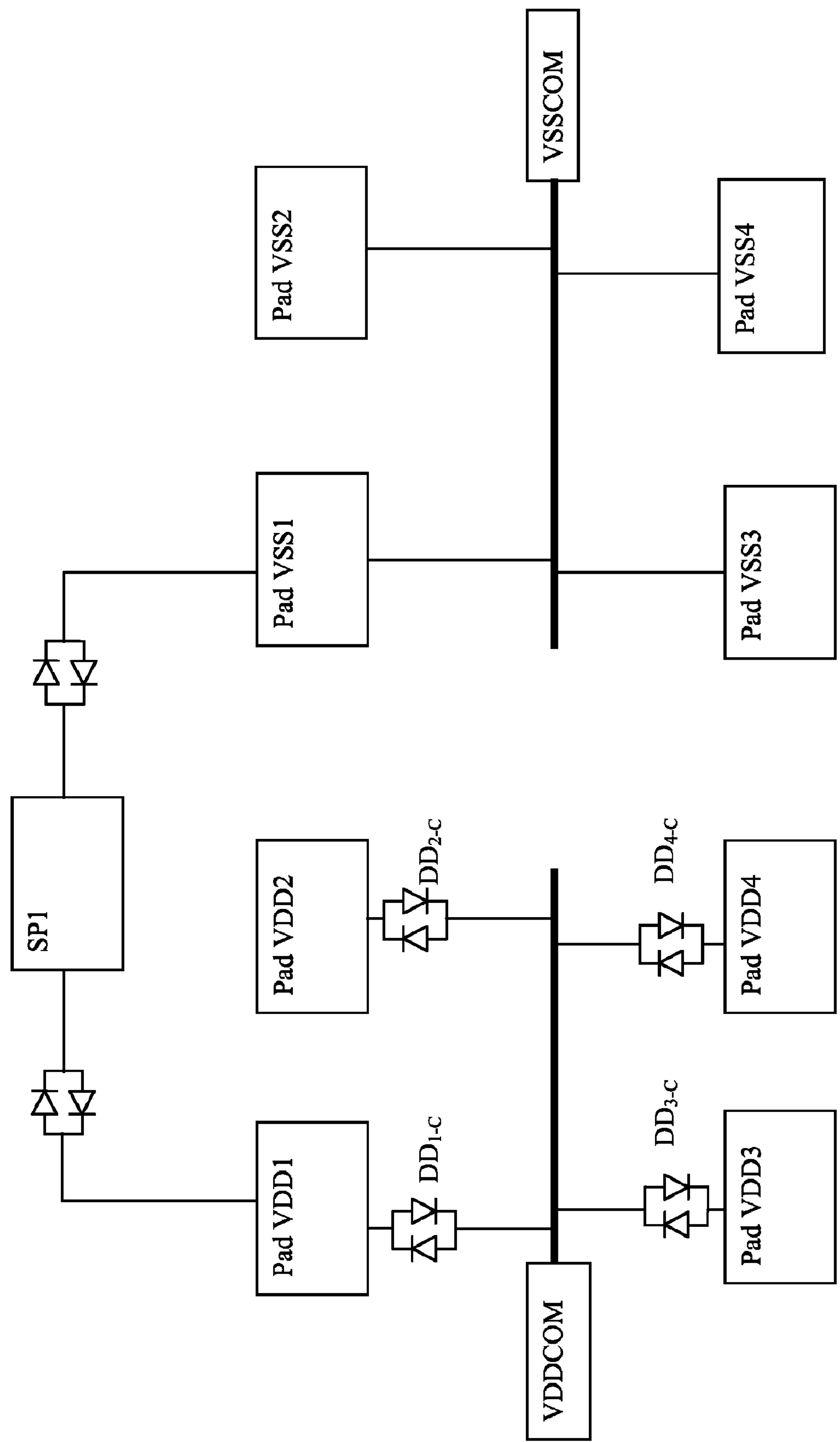
FIG. 3 is a schematic view of the voltage and ground supply pads of a system on chip embodying the present invention.

Consider for example a four unit SoC IC, each unit requiring a positive supply voltage Vdd1 to Vdd4 and a negative supply voltage Vss 1 to Vss4. A first point to note is that the voltage supplies can be referenced to a single, common negative supply voltage, i.e. ground. As is illustrated schematically in FIG. 3, all of the negative supply pads of the four blocks are connected directly to a common "ground" ESD protection ring. This ring is in turn directly connected to a common Vss pad, "VSSCOM", which is bonded to a Vsscom pin of the IC package. The four positive voltage supply pads are similarly coupled to a common ESD protection ring, but via respective pairs of back-to-back diodes. This ring is directly connected to a common Vdd pad, "VDDCOM", which is bonded to a Vddcomm pin of the IC package. FIG. 3 further illustrates a signal pad "SP1" belonging to a first of the SoC blocks powered by VDD1 and VSS1. SP1 is coupled to pad VDD1 and VSS1 by respective pairs of back-to-back diodes. As compared with a conventional SoC IC, the number of ESD protection rings is reduced from four to two. Consequently, the number of pads required to supply these rings is reduced from four to two.

The term 'diode' is used here generically, to refer to any protective electrical component that can protect against electrostatic discharges in either direction. For example, rather than utilising pairs of back-to-back diodes as illustrated in FIG. 3, any suitable arrangement of diodes and/or transistors and/or thyristors etc. may be used, and/or the gate and drain of a MOSFET may be connected together.

During bonding of the SoC, the first pad to be bonded is VSSCOM, followed by VDDCOM. Thereafter, the bonding sequence is not critical from the ESD point of view, as any spike appearing on a voltage supply or signal pad will be discharged through one of the common ESD protection rings.

Figure 1:
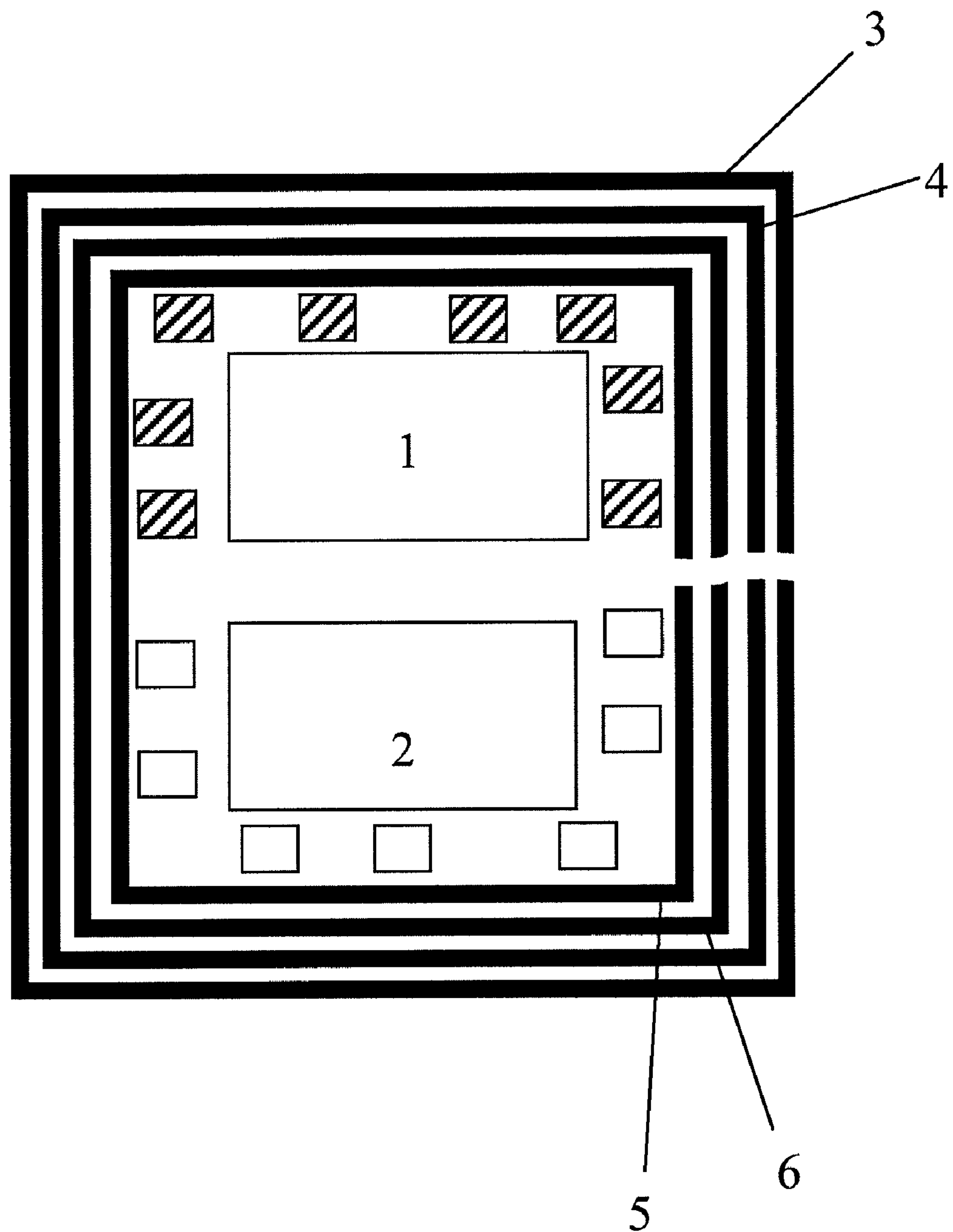
FIG. 1 illustrates schematically a prior art System on Chip with ESD protection rings.
Figure 2:
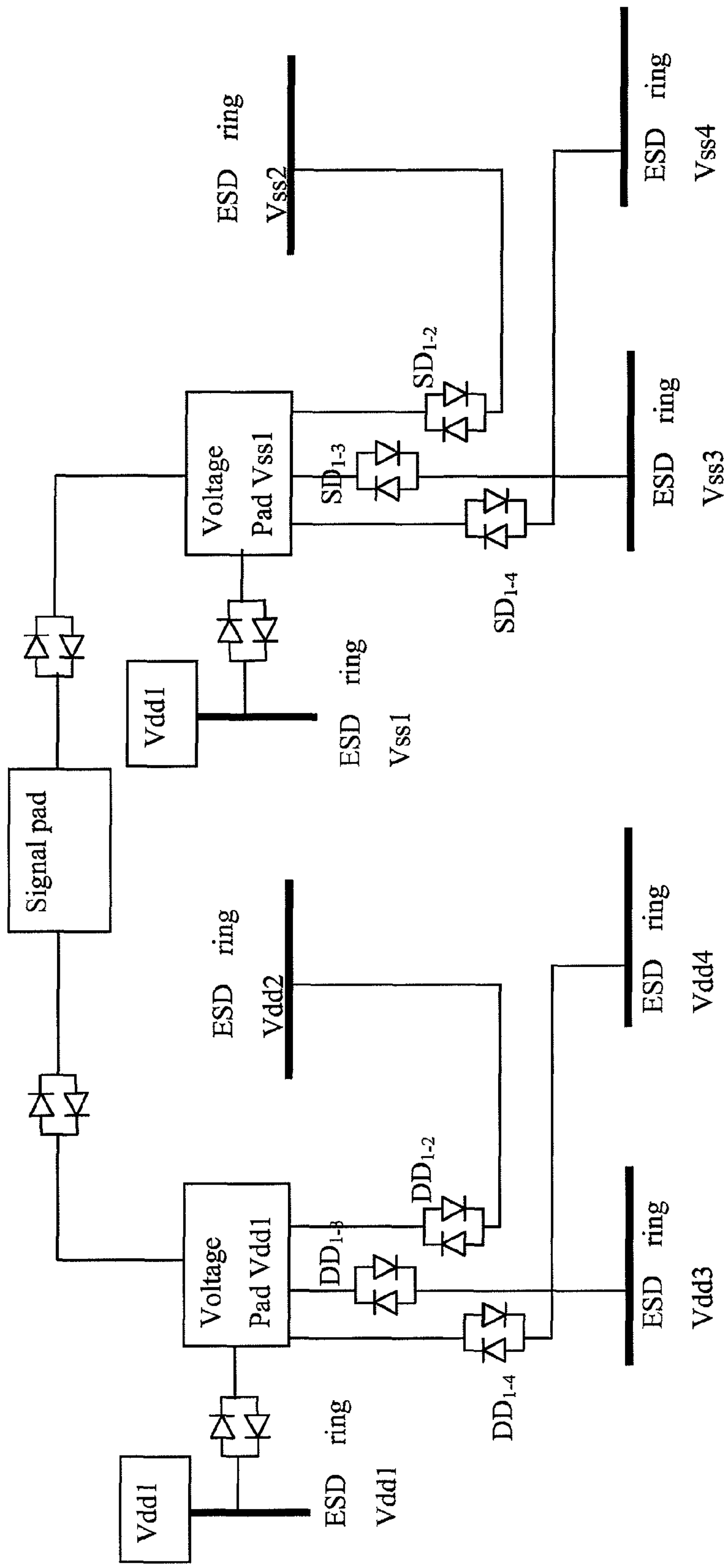
FIG. 2 illustrates schematically ESD protection circuitry of the SoC of FIG. 1.

It will be appreciated that fewer back-to-back diode pairs are required to provide ESD protection than in the known arrangement of FIG. 2. Furthermore, since each supply pad Vdd1, Vdd2, Vdd3, Vdd4 is connected to the common line (VDDCOM), the wiring/circuitry is simpler than in the arrangement shown in FIG. 2. This facilitates manufacture and decreases the cost thereof. Furthermore, the likelihood of faults occurring is reduced and variations in the ohmic paths that exist with the known arrangement of FIGS. 1 and 2 are avoided.

Figure 4:
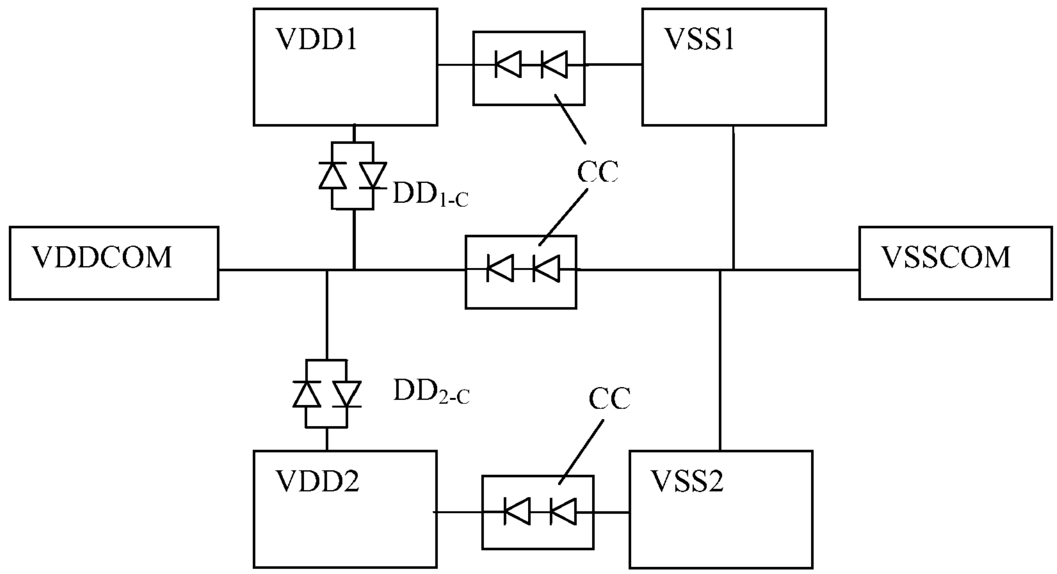
FIG. 4 is a schematic view of clamp circuitry of a system on chip embodying the present invention.

In order to provide additional protection, the voltage supply and ground pads associated with each block of the SoC are connected via a clamp circuit. FIG. 4 is a schematic view of the relationship between the voltage and ground pads. For simplicity, FIG. 4 shows only the voltage supply pads Vdd1, Vdd2 and ground pads Vss1, Vss2 of the first and second blocks 1, 2. The Voltage supply pads Vdd1, Vdd2 are connected via the back to back diodes $DD_{1-C}$, $DD_{2-C}$ to the common voltage supply line VDDCOM as in FIG. 3. The ground pads Vss1, Vss2 of the first and second blocks are connected directly to the common ground line VSSCOM as in FIG. 3. Within each block (e.g. block 1), each supply pad (e.g. Vdd1) is connected to the corresponding ground pad (e.g. Vss1) via a clamp circuit CC. The clamp circuit CC comprises protective structures (e.g. two series connected diodes) that provide a discharge path in the event that the supply voltage exceeds the permitted breakdown voltage of the block. The purpose of the clamp circuit is to hold the voltage at a predetermined threshold in order to prevent the voltage reaching or exceeding that of the clamp circuit. This prevents damage to the chip by providing a discharge path for the energy to be dispersed elsewhere, so as to prevent dangerously high voltages reaching the chip blocks. The discharge paths provide an easy path for energy to go down—so as to reduce the chance of discharge to the chip and thus reduce the likelihood of damage that could result therefrom.

During ESD testing at manufacture, all Vss pins are connected initially to ground with Vdd's floating, and positive and negative voltage spikes are applied to each of the signal pins in turn. Then, all Vdd pins are connected to ground with Vss's floating, and positive and negative voltage spikes are applied to the signal pins in turn. These tests verify the back-to-back diode protection for the signal pads, since the ESD energy will be discharged via these back-to-back diodes. In the next set of tests, all Vss pins are grounded, and all Vdd pins are connected to the supply (Vdd). Then in turn, each Vdd pin is disconnected from the supply and again hit with positive and negative ESD spikes. The positive energy spike will be discharged via the back-to-back diodes connected between the Vdd pin under test, and VDDCOM. The negative energy spike could be discharged via the back-to-back diodes and then the series diode clamp circuit connected to VSSCOM. However, this is a discharge path length of three diodes which is rather undesirable. Thus the additional clamp diodes between the Vdd and Vss pins (e.g. between Vdd1 and Vss1 in FIG. 4) allow for a shorter discharge path, only 2 diodes, for negative energy spikes.

Figure 5:
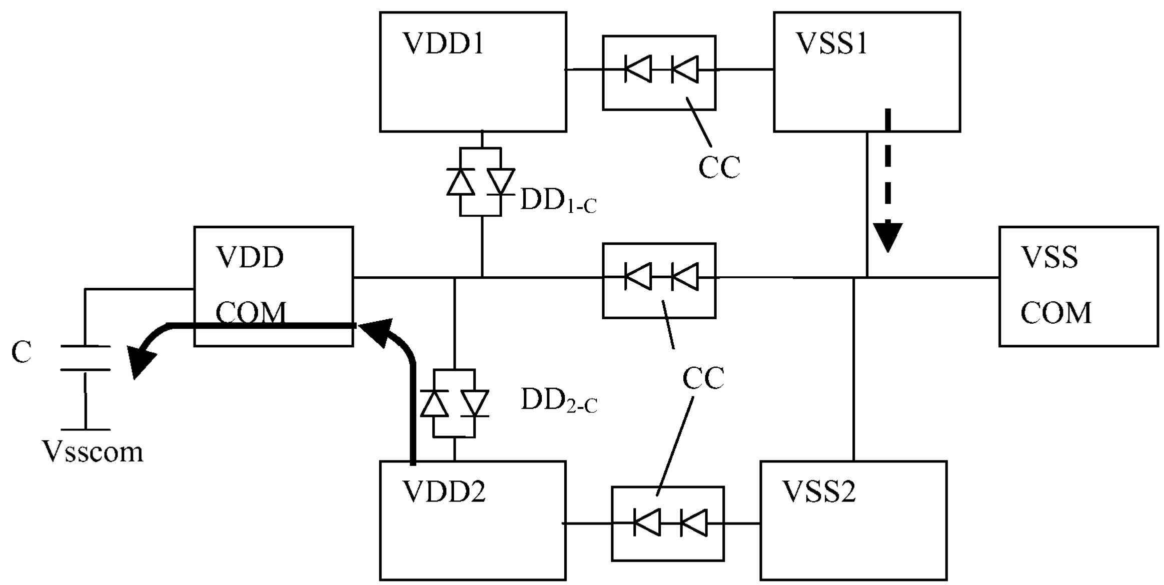
FIG. 5 shows the schematic view of FIG. 4 exemplifying pulse discharge paths.

In the event of an ESD pulse occurring on either a supply pad or a ground pad, energy is ultimately discharged to the common ground line, VSSCOM. FIG. 5 shows an example of an ESD positive-going pulse discharge path (denoted by the solid arrow) for an ESD event that has occurred on a supply pad, Vdd2. ESD energy is discharged from the supply pad Vdd2, through the back-to-back diode arrangement $DD_2$—, through the common supply pad Vddcom, and finally through a capacitor C to the common ground line, VSSCOM. It is convenient for the capcitor C to be an external decoupling capacitor (i.e. off chip). For clarity, the connection to the common ground line is labelled separately on the left hand side of FIG. 5, but it will be appreciated that this is the same common ground line VSSCOM as depicted on the right hand side of FIG. 5.

FIG. 5 also shows (by way of the dashed arrow), the discharge path for an ESD event on a Vss pad. In this case, an ESD pulse would simply be grounded to the ground point to which all voltages are referred, i.e. directly to the common ground line VSSCOM.

The ESD protection circuitry of embodiments of the present invention avoid the need to power up the individual blocks of a SoC IC as the provision of a common voltage supply, VDDCOM, ensures ESD protection is provided to all Vdd pads initially and simultaneously. Similarly, the provision of a common ground, VSSCOM, ensures that ESD protection is provided to all Vss pads initially and simultaneously. As for the prior art arrangement of FIG. 1, the common supply and ground lines may be provided in the form of rings extending around almost the entire chip. This is a convenient arrangement as it does not take away chip area that could be used for routing between blocks.

The ESD protective circuitry of embodiments of the present invention may be utilized, for example in the Sensium™ TZ1030 chip, manufactured by Toumaz Technology Ltd. The Sensium™ chip is an ultra low power wireless sensor interface platform than may be used in medical applications such as ECG monitoring, temperature monitoring, and the monitoring of blood glucose and oxygen levels etc. The chip can transmit or receive 2.5 nW power at 1V at one reading per day. Sensors wearable on a patient's body generate signals that are transmitted to the chip for processing/monitoring.

Embodiments of the present invention are particularly suitable for use in the Sensium™ chip, which contains a plurality of different blocks. Common ESD protection provides for all pads being protected at the same time, thus avoiding potential liability in having to power up the chip in a specified sequence. Once the Vddcom and Vsscom pads are ESD protected, there is immediate protection for the whole of the chip.

It is to be noted that SoCs are also susceptible to latent damage in the event of an ESD event. Rather than causing a component to fail, an ESD event may cause the characteristics of a component on the SoC to change. This could lead to a situation whereby it is not apparent from testing an SoC that damage has been sustained and thus there would be no way of knowing the effect that the ESD event had. Embodiments of the present invention provide a more reliable way to ensure ESD protection of SoCs—through the essentially simultaneous and instantaneous ESD protection provided, thus minimising the chances of latent damage. This is particularly important in SoCs used in the medical field, where it could be vital to ensure correct operation of an SoC.

It will however be appreciated that embodiments of the present invention may be utilised in any chip having a plurality of blocks, and thus utilised in any number of different applications not limited to the medical field.

It will be appreciated by the person of skill in the art that various modifications may be made to the above described embodiments without departing from the scope of the present invention. For example, whilst the embodiments described have involved, for each block, only a single positive and negative supply pad (Vss and Vdd), in some cases blocks may be provided with a plurality of one or other of these voltage supply pads. Of course, in this case, as ESD protection must be provided for each pad, the saving in terms of component count is even greater as compared with conventional ESD protection solutions.

The invention claimed is:

1. An integrated circuit having a plurality of circuit blocks, each block having one or more positive voltage supply pads, one or more negative voltage supply pads, and one or more signal pads, the integrated circuit further comprising an electrostatic protection circuit comprising:

- a first electrostatic discharge protection rail for connection to a positive voltage supply point;
- a second electrostatic discharge protection rail connected directly to said negative voltage supply pads, the second electrostatic discharge protection rail being further configured for connection to a negative voltage supply point;
- a first protection circuitry coupling each said signal pad to both said first and second electrostatic discharge protection rails, the first protection circuitry being configured to provide a conduction path to one of the first and second electrostatic discharge protection rails in the event of an excessive voltage being present on one of said signal pads; and
- a second protection circuitry coupling each said positive voltage supply pad to said first electrostatic discharge protection rail, the second protection circuitry being configured to provide a conduction path to the first electrostatic discharge protection rail in the event of an excessive voltage being present on one of said positive voltage supply pads.

2. An integrated circuit according to claim 1, wherein said first and second protection circuitry comprises, for each pad, a pair of back-to-back diodes coupling the pad to a corresponding one of the electrostatic discharge protection rails.

3. An integrated circuit according to claim 1, wherein the positive voltage supply pads of different circuit blocks are connected to different voltage supply pins of the integrated circuit.

4. An integrated circuit according to claim 1, each of said first and second electrostatic discharge protection rails extending substantially around the entire periphery of the integrated circuit.

5. An integrated circuit having a plurality of circuit blocks, each block having one or more positive voltage supply pads, one or more negative voltage supply pads, and one or more signal pads, the integrated circuit further comprising an electrostatic protection circuit comprising:

a first electrostatic discharge protection rail for connection to a positive voltage supply point;

a first protection circuitry coupling each said positive voltage supply pad to said first electrostatic discharge protection rail, the first protection circuitry being configured to provide a conduction path to the first electrostatic discharge protection rail in the event of an excessive voltage being present on one of said positive voltage supply pads;

a second electrostatic discharge protection rail for connection to a negative voltage supply point and direct connection to each said negative supply voltage pad; and a second protection circuitry coupling each said signal pad to both said first and second electrostatic discharge protection rails, the second protection circuitry being configured to provide a conduction path to one of the first and second electrostatic discharge protection rails in the event of an excessive voltage being present on one of said signal pads.

* * * * *